United States Patent
Min (10) Patent No.: US 11,054,477 B2
(45) Date of Patent: Jul. 6, 2021

(54) APPARATUS, BATTERY SYSTEM AND METHOD FOR CONTROLLING MAIN BATTERY AND SUB BATTERY

(71) Applicant: LG CHEM, LTD., Seoul (KR)

(72) Inventor: Kyoung-Choon Min, Daejeon (KR)

(73) Assignee: LG CHEM, LTD., Seoul (KR)

( * ) Notice: Subject to any disclaimer, the term of this patent is extended or adjusted under 35 U.S.C. 154(b) by 28 days.

(21) Appl. No.: 16/634,740

(22) PCT Filed: Feb. 15, 2019

(86) PCT No.: PCT/KR2019/001883
§ 371 (c)(1),
(2) Date: Jan. 28, 2020

(87) PCT Pub. No.: WO2019/221368
PCT Pub. Date: Nov. 21, 2019

(65) Prior Publication Data
US 2020/0209321 A1      Jul. 2, 2020

(30) Foreign Application Priority Data

May 15, 2018  (KR) .......................... 10-2018-0055610

(51) Int. Cl.
*G01R 31/3842* (2019.01)
*H01M 10/48* (2006.01)
*H02J 1/10* (2006.01)

(52) U.S. Cl.
CPC ...... *G01R 31/3842* (2019.01); *H01M 10/482* (2013.01); *H02J 1/10* (2013.01)

(58) Field of Classification Search
CPC .... G01R 31/3842; H01M 10/482; H02J 1/10; H02J 7/00712; H02J 7/0013; H02J 7/0063;
(Continued)

(56) References Cited

U.S. PATENT DOCUMENTS

| | | | | |
|---|---|---|---|---|
| 6,390,215 B1 * | 5/2002 | Kodama | ................. | B60L 50/62 |
| | | | | 180/65.22 |
| 8,433,373 B2 * | 4/2013 | Song | ................. | H04W 52/0261 |
| | | | | 455/573 |
| 8,575,777 B2 * | 11/2013 | Tae | ......................... | B60L 50/64 |
| | | | | 307/9.1 |
| 9,086,461 B2 * | 7/2015 | Yang | .................... | G01R 31/396 |

(Continued)

FOREIGN PATENT DOCUMENTS

| | | |
|---|---|---|
| JP | 60-188472 U | 12/1985 |
| JP | 2000-341196 A | 12/2000 |

(Continued)

OTHER PUBLICATIONS

International Search Report issued in PCT/KR2019/001883 (PCT/ISA/210), dated Jun. 5, 2019.

(Continued)

*Primary Examiner* — M Baye Diao
(74) *Attorney, Agent, or Firm* — Birch, Stewart, Kolasch & Birch, LLP (57) ABSTRACT

An apparatus, a battery system and a method for controlling a main battery and a sub battery. The apparatus includes a first main switch connectable between the main battery and an electrical load, a second main switch connectable between the sub battery and the electrical load, a sub switch connectable between the main battery and the sub battery, a main battery management system and a sub battery management system. The main battery management system transmits a first diagnosis message to the sub battery management system, when a fault of the main battery is detected. The sub battery management system induces the second main switch into a turn on state, in response to the first diagnosis message.

11 Claims, 7 Drawing Sheets

(58) Field of Classification Search
CPC ...... H02J 7/00032; H02J 7/342; H02J 7/0031; H02J 7/00302; H02J 7/00306; H02J 7/00309; Y02E 60/10; Y02T 10/70
USPC ........................................................ 324/434
See application file for complete search history.

(56) References Cited

U.S. PATENT DOCUMENTS

| | | |
|---|---|---|
| 2004/0075345 A1 | 4/2004 | Yoshioka et al. |
| 2008/0048608 A1 | 2/2008 | Lim et al. |
| 2008/0048621 A1 | 2/2008 | Yun |
| 2009/0021216 A1 | 1/2009 | Hills et al. |
| 2009/0218989 A1 | 9/2009 | Davis |
| 2010/0004885 A1 | 1/2010 | Nakanishi |
| 2012/0161714 A1 | 6/2012 | Ishibashi |
| 2013/0338871 A1 | 12/2013 | Kubo et al. |
| 2014/0261250 A1 | 9/2014 | Katayama et al. |
| 2014/0265604 A1 | 9/2014 | Mergener |
| 2015/0239411 A1 | 8/2015 | Nakajima et al. |
| 2018/0172769 A1 | 6/2018 | Yoon et al. |

FOREIGN PATENT DOCUMENTS

| | | |
|---|---|---|
| JP | 2005-80347 A | 3/2005 |
| JP | 2008-288192 A | 11/2008 |
| JP | 2014-3742 A | 1/2014 |
| JP | 5391805 B2 | 1/2014 |
| JP | 2014-180151 A | 9/2014 |
| JP | 2015-89293 A | 5/2015 |
| JP | 2016-132402 A | 7/2016 |
| JP | 2017-28773 A | 2/2017 |
| KR | 10-2011-0136468 A | 12/2011 |
| KR | 10-2014-0013250 A | 2/2014 |
| KR | 10-2017-0062328 A | 6/2017 |
| KR | 10-2017-0071949 A | 6/2017 |
| KR | 10-2018-0026947 A | 3/2018 |
| WO | WO 2014/068883 A1 | 5/2014 |

OTHER PUBLICATIONS

Extended European Search Report for European Application No. 19803303.7, dated Jun. 18, 2020.

* cited by examiner

APPARATUS, BATTERY SYSTEM AND METHOD FOR CONTROLLING MAIN BATTERY AND SUB BATTERY

TECHNICAL FIELD

The present disclosure relates to an apparatus, a battery system and a method for supplying power to an electrical load selectively using any one of a main battery and a sub battery.

The present application claims priority to Korean Patent Application No. 10-2018-0055610 filed in the Republic of Korea on May 15, 2018, the disclosure of which is incorporated herein by reference.

BACKGROUND ART

Recently, there is dramatically growing demand for portable electronic products such as laptop computers, video cameras and mobile phones, and with the extensive development of electric vehicles, accumulators for energy storage, robots and satellites, many studies are being made on high performance secondary batteries that can be recharged repeatedly.

Currently, commercially available secondary batteries include nickel-cadmium batteries, nickel-hydrogen batteries, nickel-zinc batteries, lithium secondary batteries and the like, and among them, lithium secondary batteries have little or no memory effect, and thus they are gaining more attention than nickel-based secondary batteries for their advantages of free charging and discharging, a very low self-discharge rate and high energy density.

A battery management system is electrically connected to a battery, and is configured to measure an electrical property value (for example, voltage, current and temperature) of the battery, and control the battery based on the measured electrical property value.

When a fault (for example, over-charge, over-discharge, over-heat) occurs by various reasons during charging or discharging of the battery, the battery management system shuts down the electrical connection between the battery and the electrical load to protect the battery. However, when the electrical connection between the battery and the electrical load is suddenly shut down, the operation of the electrical load is disabled and there is a risk that an accident (for example, abrupt stop of an electric vehicle) may occur.

DISCLOSURE

Technical Problem

The present disclosure is designed to solve the above-described problem, and therefore the present disclosure is directed to providing an apparatus, a battery system and a method for supplying power to an electrical load using a sub battery installed connectably in parallel to a main battery, even when a fault occurs in the main battery.

These and other objects and advantages of the present disclosure may be understood by the following description and will be apparent from the embodiments of the present disclosure. Further, it will be readily understood that the objects and advantages of the present disclosure may be realized by the means set forth in the appended claims and combinations thereof.

Technical Solution

Various embodiments of the present disclosure for achieving the above-described object are as follows.

An apparatus for controlling a main battery and a sub battery according to an aspect of the present disclosure includes a first main switch connectable between the main battery and an electrical load, a second main switch connectable between the sub battery and the electrical load, a sub switch connectable between the main battery and the sub battery, a main battery management system operably coupled to the first main switch, and a sub battery management system operably coupled to the second main switch and the sub switch. The main battery management system is configured to transmit a first diagnosis message to the sub battery management system, and stop outputting a first control signal to the first main switch to induce the first main switch into a turn off state, when a fault of the main battery is detected. The first diagnosis message has a flag including at least one value indicating a type of the detected fault. The sub battery management system is configured to output a second control signal to the second main switch to induce the second main switch into a turn on state, in response to the first diagnosis message.

The sub battery management system may be configured to output a third control signal to the sub switch to induce the sub switch into the turn on state, when a first value is included in the flag. The first value may indicate that the main battery is over-charged.

The sub battery management system may be configured to stop outputting a third control signal to the sub switch to induce the sub switch into the turn off state, when a second value or a third value is included in the flag. The second value may indicate that the main battery is over-discharged, and the third value may indicate that the main battery is over-heated.

The main battery management system may be configured to stop transmitting the first diagnosis message and output the first control signal to the first main switch, when the fault of the main battery is resolved. The sub battery management system may be configured to stop outputting the second control signal when the transmission of the first diagnosis message from the main battery management system is stopped.

The main battery management system may include a first controller configured to detect whether a fault occurred in the main battery based on at least one of a voltage, a current and a temperature of the main battery, and a second controller operably coupled to the first controller and configured to transmit a second diagnosis message to the sub battery management system and induce the first controller to a sleep state when the second controller determines that the first controller is malfunctioning. The sub battery management system may be configured to output the second control signal to the second main switch, in response to the second diagnosis message.

The sub battery management system may be configured to output a third control signal to the sub switch to induce the sub switch into the turn on state, in response to the second diagnosis message.

A battery system according to another aspect of the present disclosure includes the apparatus.

A method according to still another aspect of the present disclosure is for controlling a main battery and a sub battery using a first main switch connected between the main battery and an electrical load, a second main switch connected between the sub battery and the electrical load, a sub switch connected between the main battery and the sub battery, a main battery management system operably coupled to the main battery and the first main switch and configured to detect a fault of the main battery, and a sub battery management system operably coupled to the second main switch and the sub switch. The method includes transmitting, by the main battery management system, a first diagnosis message to the sub battery management system, and stopping outputting a first control signal to the first main switch to induce the first main switch into a turn off state, when a fault of the main battery is detected, wherein the first diagnosis message has a flag including at least one value indicating a type of the detected fault, and outputting, by the sub battery management system, a second control signal to the second main switch to induce the second main switch into a turn on state, in response to the first diagnosis message.

The method may further include outputting, by the sub battery management system, a third control signal to the sub switch to induce the sub switch into the turn on state, when a first value is included in the flag. The first value indicates that the main battery is over-charged.

The method may further include stopping, by the sub battery management system, outputting a third control signal to the sub switch to induce the sub switch into the turn off state, when a second value or a third value is included in the flag. The second value indicates that the main battery is over-discharged, and the third value indicates that the main battery is over-heated.

The method may further include outputting, by the sub battery management system, the second control signal to the second main switch, in response to a second diagnosis message from the main battery management system. The second diagnosis message indicates that the main battery management system is malfunctioning.

Advantageous Effects

According to at least one of the embodiments of the present disclosure, when a fault occurs in the main battery or the battery management system for the main battery is malfunctioning, it is possible to supply power to the electrical load using the sub battery installed connectably in parallel to the main battery.

In addition, according to at least one of the embodiments of the present disclosure, it is possible to charge the sub battery using the main battery while the sub battery is supplying power to the electrical load.

The effects of the present disclosure are not limited to the effects mentioned above, and these and other effects will be clearly understood by those skilled in the art from the appended claims.

BRIEF DESCRIPTION OF DRAWINGS

The accompanying drawings illustrate a preferred embodiment of the present disclosure, and together with the detailed description of the present disclosure as described below, serve to provide a further understanding of the technical aspects of the present disclosure, and thus the present disclosure should not be construed as being limited to the drawings.

MODE FOR DISCLOSURE

Hereinafter, the preferred embodiments of the present disclosure will be described in detail with reference to the accompanying drawings. Prior to the description, it should be understood that the terms or words used in the specification and the appended claims should not be construed as being limited to general and dictionary meanings, but interpreted based on the meanings and concepts corresponding to the technical aspects of the present disclosure on the basis of the principle that the inventor is allowed to define the terms appropriately for the best explanation.

Therefore, the embodiments described herein and illustrations shown in the drawings are just a most preferred embodiment of the present disclosure, but not intended to fully describe the technical aspects of the present disclosure, so it should be understood that a variety of other equivalents and modifications could be made thereto at the time of filing the application.

Additionally, in describing the present disclosure, when it is deemed that a certain detailed description of relevant known elements or functions renders the key subject matter of the present disclosure ambiguous, the detailed description is omitted herein.

The terms including the ordinal number such as "first", "second" and the like, are used to distinguish one element from another among various elements, but not intended to limit the elements by the terms.

Unless the context clearly indicates otherwise, it will be understood that the term "comprises" or "includes" when used in this specification, specifies the presence of stated elements, but does not preclude the presence or addition of one or more other elements. Additionally, the term <control unit> as used herein refers to a processing unit of at least one function or operation, and this may be implemented by hardware or software alone or in combination.

In addition, throughout the specification, it will be further understood that when an element is referred to as being "connected to" another element, it can be directly connected to the other element or intervening elements may be present.

Figure 1:
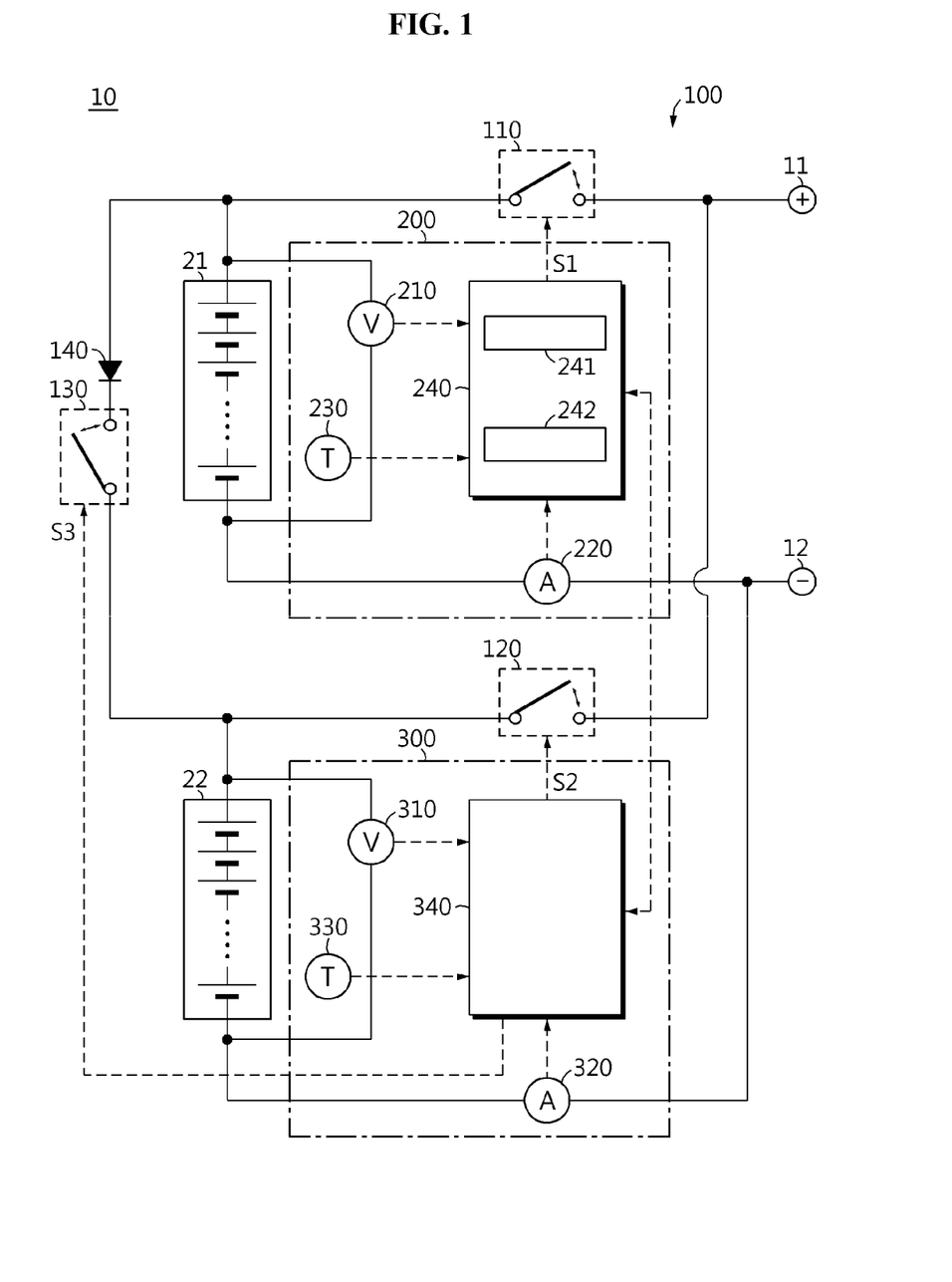
FIG. 1 is a diagram showing an exemplary configuration of a battery system according to an embodiment of the present disclosure.

FIG. 1 is a diagram showing an exemplary configuration of a battery system 10 according to an embodiment of the present disclosure.

Referring to FIG. 1, the battery system 10 includes a first power terminal 11, a second power terminal 12, a main battery 21, a sub battery 22 and a control apparatus 100. The battery system 10 is for supplying power to an electrical load (for example, an electric motor of an electric vehicle) through the first power terminal 11 and the second power terminal 12.

The main battery 21 includes at least one battery cell. The sub battery 22 includes at least one battery cell. Each battery cell included in the main battery 21 and the sub battery 22 may be a rechargeable battery such as, for example, a lithium ion battery, a lithium polymer battery, a nickel cadmium battery, a nickel hydrogen battery or a nickel zinc battery. The negative terminal of the main battery 21 and the negative terminal of the sub battery 22 are connected in common to the second power terminal 12 through a conductor (for example, a busbar, an electrical cable). The output voltage of the main battery 21 may be higher than the output voltage of the sub battery 22.

The control apparatus 100 includes a first main switch 110, a second main switch 120, a sub switch 130, a main battery management system 200 (hereinafter referred to as MBMS) and a sub battery management system 300 (hereinafter referred to as SBMS).

The first main switch 110 is provided connectably between the positive terminal of the main battery 21 and the first power terminal 11. While the first main switch 110 has a turn on state, a current channel between the positive terminal of the main battery 21 and the first power terminal 11 is provided. While the first main switch 110 has a turn off state, the current channel between the positive terminal of the main battery 21 and the first power terminal 11 is interrupted.

The second main switch 120 is provided connectably between the positive terminal of the sub battery 22 and the first power terminal 11. While the second main switch 120 has a turn on state, a current channel between the positive terminal of the sub battery 22 and the first power terminal 11 is provided. While the second main switch 120 has a turn off state, the current channel between the positive terminal of the sub battery 22 and the first power terminal 11 is interrupted.

The sub switch 130 is provided connectably between the positive terminal of the main battery 21 and the positive terminal of the sub battery 22. While the sub switch 130 has a turn on state, a current channel between the positive terminal of the main battery 21 and the positive terminal of the sub battery 22 is provided. That is, while the sub switch 130 has a turn on state, the main battery 21 and the sub battery 22 are connected in parallel. While the sub switch 130 has a turn off state, the current channel between the positive terminal of the main battery 21 and the positive terminal of the sub battery 22 is interrupted. The control apparatus 100 may further includes a diode 140 connected in series to the sub switch 130 between the positive terminal of the main battery 21 and the positive terminal of the sub battery 22. An anode of the diode 140 may be connected to the positive terminal side of the main battery 21, and a cathode of the diode 140 may be connected to the positive terminal side of the sub battery 22. Accordingly, a flow of current from the positive terminal of the main battery 21 to the positive terminal of the sub battery 22 is allowed, while a flow of current from the positive terminal of the sub battery 22 to the positive terminal of the main battery 21 is interrupted.

The MBMS 200 includes a voltage sensor 210, a current sensor 220, a temperature sensor 230 and a control unit 240. The voltage sensor 210 is configured to measure the voltage across the main battery 21. The current sensor 220 is configured to measure the current flowing through the main battery 21. The temperature sensor 230 is configured to measure the temperature of the main battery 21.

The control unit 240 is operably coupled to the first main switch 110 and the SBMS 300. The control unit 240 may be implemented in hardware using at least one of application specific integrated circuits (ASICs), digital signal processors (DSPs), digital signal processing devices (DSPDs), programmable logic devices (PLDs), field programmable gate arrays (FPGAs), microprocessors and electrical units for performing other functions. A memory device may be embedded in the control unit 240, and the memory device may include, for example, RAM, ROM, register, hard disk, an optical recording medium or a magnetic recording medium. The memory device may store, update and/or erase programs including various types of control logics that are executed by the control unit 240, and/or data created when the control logics are executed.

The control unit 240 includes a first controller 241 and a second controller 242. The first controller 241 is operably coupled to the voltage sensor 210, the current sensor 220 and the temperature sensor 230. The first controller 241 is configured to detect a fault (for example, over-charge, over-discharge, over-heat) of the main battery 21 based on the voltage, current and temperature measured by the voltage sensor 210, the current sensor 220 and the temperature sensor 230, and control the main battery 21. The second controller 242 is operably coupled to the first controller 241, and is configured to determine whether the first controller 241 is malfunctioning. The second controller 242 may periodically transmit a check signal to the first controller 241. The first controller 241 may transmit a response signal to the second controller 242 in response to the check signal. When the response signal from the first controller 241 is received within a predetermined time from the time point at which the check signal was transmitted, the second controller 242 may determine that the first controller 241 is normally operating. On the contrary, when the response signal from the first controller 241 is not received within the predetermined time from the time point at which the check signal was transmitted to the first controller 241, the second controller 242 may determine that the first controller 241 is malfunctioning.

The SBMS 300 includes a voltage sensor 310, a current sensor 320, a temperature sensor 330 and a control unit 340. The voltage sensor 310 is configured to measure the voltage across the sub battery 22. The current sensor 320 is configured to measure the current flowing through the sub battery 22. The temperature sensor 330 is configured to measure the temperature of the sub battery 22.

The control unit 340 is operably coupled to the control unit 240, the first main switch 110, the second main switch 120, the sub switch 130, the voltage sensor 310, the current sensor 320 and the temperature sensor 330. The control unit 340 may be implemented in hardware using at least one of application specific integrated circuits (ASICs), digital signal processors (DSPs), digital signal processing devices (DSPDs), programmable logic devices (PLDs), field programmable gate arrays (FPGAs), microprocessors and electrical units for performing other functions. A memory device may be embedded in the control unit 340, and the memory device of the control unit 340 may include, for example, RAM, ROM, register, hard disk, an optical recording medium or a magnetic recording medium. The memory device of the control unit 340 may store, update and/or erase programs including various types of control logics that are executed by the control unit 340, and/or data created when the control logics are executed. The control unit 340 is configured to detect a fault (for example, over-charge, over-discharge, over-heat) of the sub battery 22, based on the voltage, current and temperature measured by the voltage sensor 310, the current sensor 320 and the temperature sensor 330, and control the sub battery 22.

Figure 2:
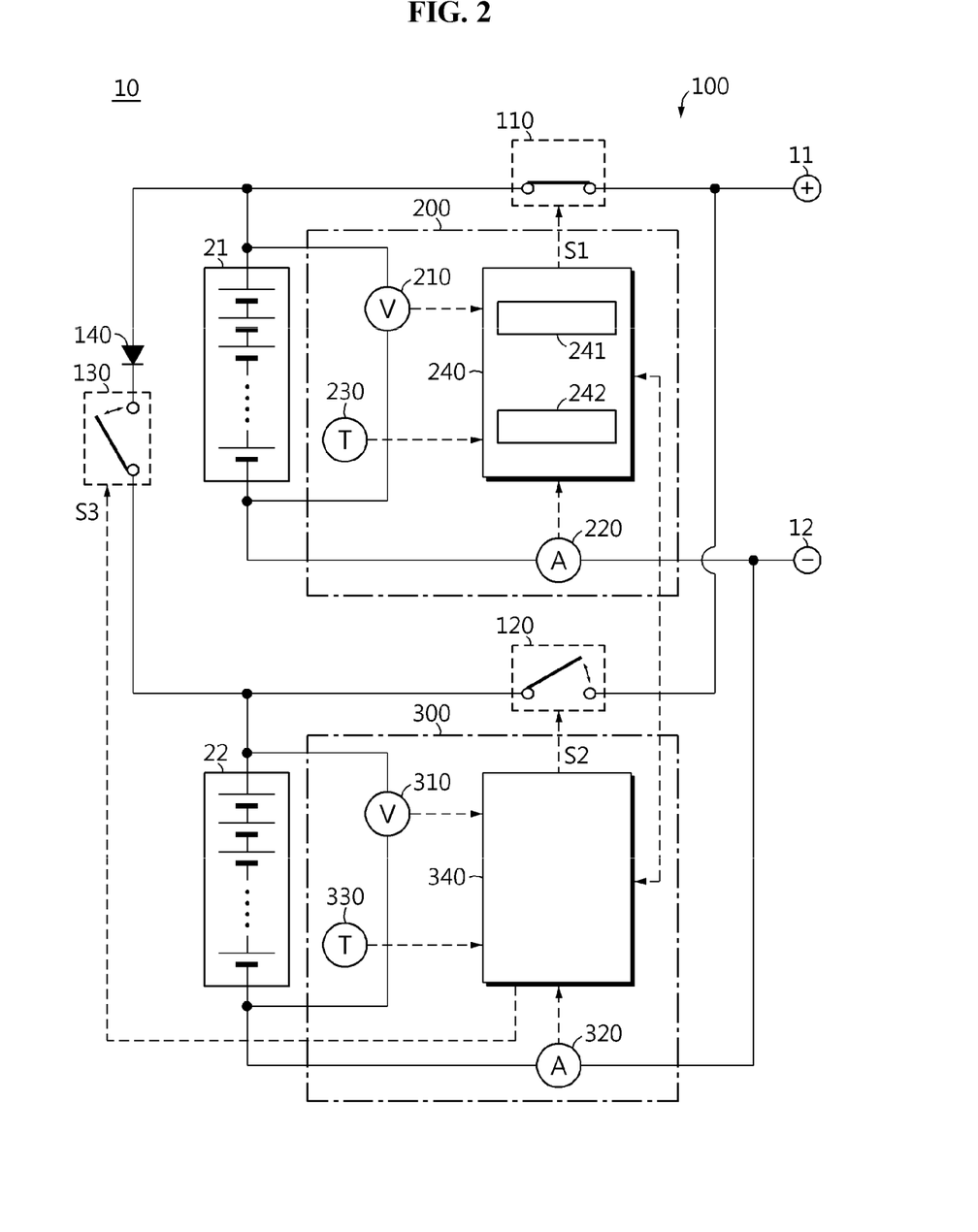
FIG. 2 is a diagram for reference in illustrating the operation performed by a control apparatus when a fault of a main battery of FIG. 1 is not detected.

FIG. 2 is a diagram for reference in illustrating the operation performed by the control apparatus 100 when a fault of the main battery 21 of FIG. 1 is not detected.

Referring to FIG. 2, when a fault of the main battery 21 is not detected, the MBMS 200 outputs a first control signal S1 to the first main switch 110. The first control signal S1 is a signal for inducing the first main switch 110 into a turn on state. That is, the first main switch 110 goes into a turn on state in response to the first control signal S1.

When a first diagnosis message or a second diagnosis message as described below is not transmitted from the MBMS 200 to the SBMS 300, the SBMS 300 operates in a sleep mode. The SBMS 300 wakes up in response to receiving the first diagnosis message or the second diagnosis message from the MBMS 200. In the sleep mode, the SBMS 300 stops outputting a second control signal S2 and a third control signal S3. The second control signal S2 is a signal for inducing the second main switch 120 into a turn on state. The third control signal S3 is a signal for inducing the sub switch 130 into a turn on state.

As a result, when a fault of the main battery 21 is not detected, the first main switch 110 goes into a turn on state, while both the second main switch 120 and the sub switch 130 go into a turn off state as shown in FIG. 2, and thus the main battery 21 supplies power to the electrical load.

Figure 3:
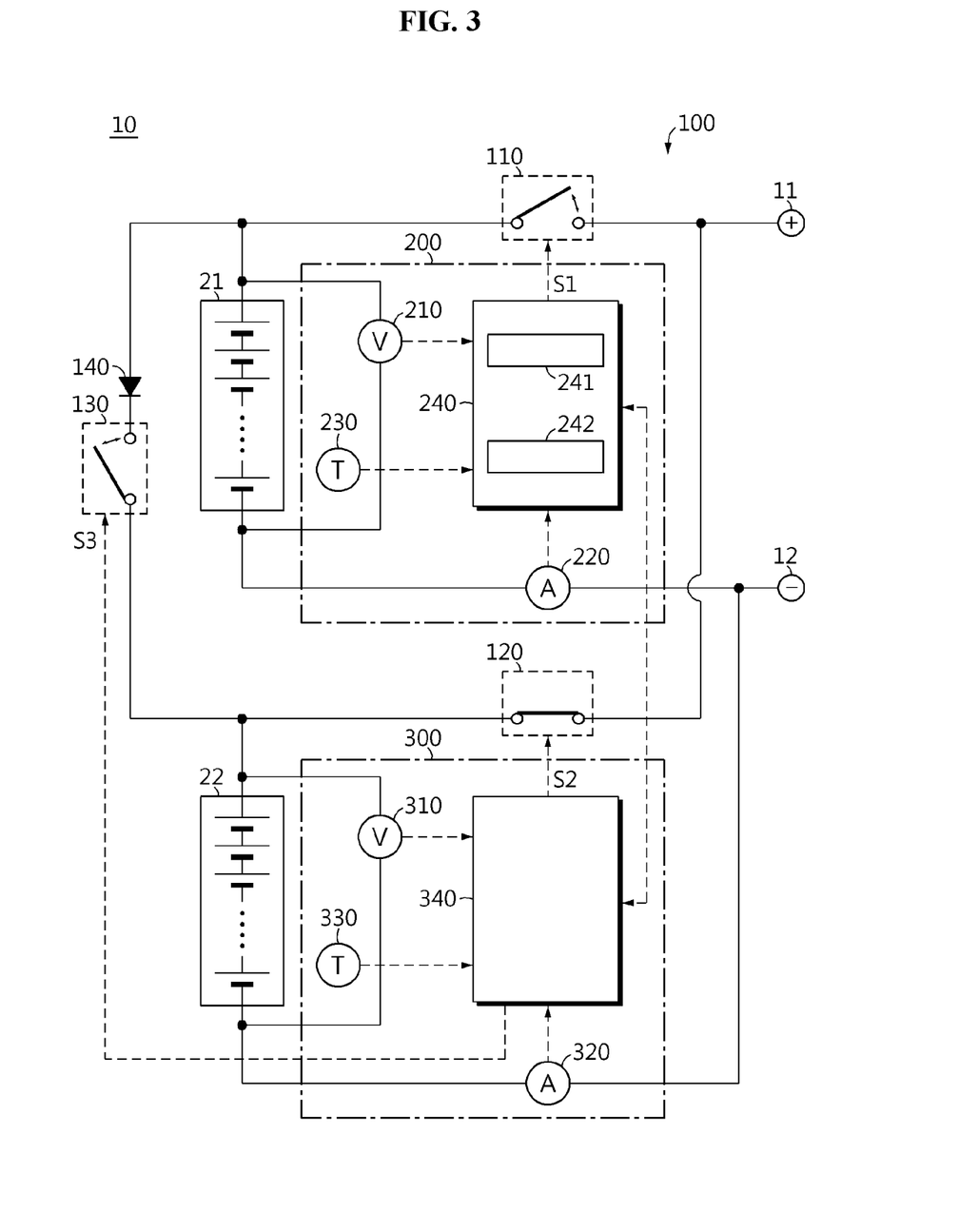
FIG. 3 is a diagram for reference in illustrating the operation performed by a control apparatus when a fault of a main battery of FIG. 1 is detected.

FIG. 3 is a diagram for reference in illustrating the operation performed by the control apparatus 100 when a fault of the main battery 21 of FIG. 1 is detected.

Referring to FIG. 3, when a fault of the main battery 21 is detected by the first controller 241, the MBMS 200 transmits the first diagnosis message to the SBMS 300, and stops outputting the first control signal S1. The first diagnosis message is a message for informing the SBMS 300 that a fault of the main battery 21 is detected. The first diagnosis message includes a flag indicating the type of fault detected from the main battery 21. The flag may include at least one of a first value, a second value and a third value. The first value may indicate that the main battery 21 is over-charged, the second value may indicate that the main battery 21 is over-discharged, and the third value may indicate that the main battery 21 is over-heated.

The SBMS 300 wakes up in response to the first diagnosis message from the MBMS 200, and outputs a second control signal S2 to the second main switch 120. The SBMS 300 may selectively output a third control signal S3 to the sub switch 130 according to whether the first value is included in the flag. That is, when at least one of the second value and the third value is included in the flag of the first diagnosis message, the SBMS 300 may stop outputting the third control signal S3 to induce the sub switch 130 into a turn off state, and when only the first value is included in the flag, the SBMS 300 may output the third control signal S3 to induce the sub switch 130 into a turn on state.

As a result, when a fault of the main battery 21 is detected, irrespective of the type of the fault, the first main switch 110 goes into a turn off state and the second main switch 120 goes into a turn on state as shown in FIG. 3, thus the sub battery 22 supplies power to the electrical load in replacement of the main battery 21. Additionally, when over-discharge and over-heat of the main battery 21 are not detected and over-charge of the main battery 21 is detected, the sub switch 130 goes into a turn on state. Accordingly, it is possible to charge the sub battery 22 using electrical energy from the over-charged main battery 21.

When the fault of the main battery 21 is resolved, the MBMS 200 may stop transmitting the first diagnosis message, and output the first control signal S1. In detail, when the voltage, current, State-Of-Charge (SOC) and temperature of the main battery 21 are all in a predetermined normal range while the first diagnosis message is transmitted to the SBMS 300, the MBMS 200 stops transmission of the first diagnosis message to the SBMS 300. The MBMS 200 may calculate the SOC of the main battery 21 by integrating the current value measured by the current sensor 220 using the ampere counting method. The SBMS 300 may determine that the fault of the main battery 21 is resolved when the first diagnosis message from the MBMS 200 is not received, then may stop outputting the second control signal S2.

Figure 4:
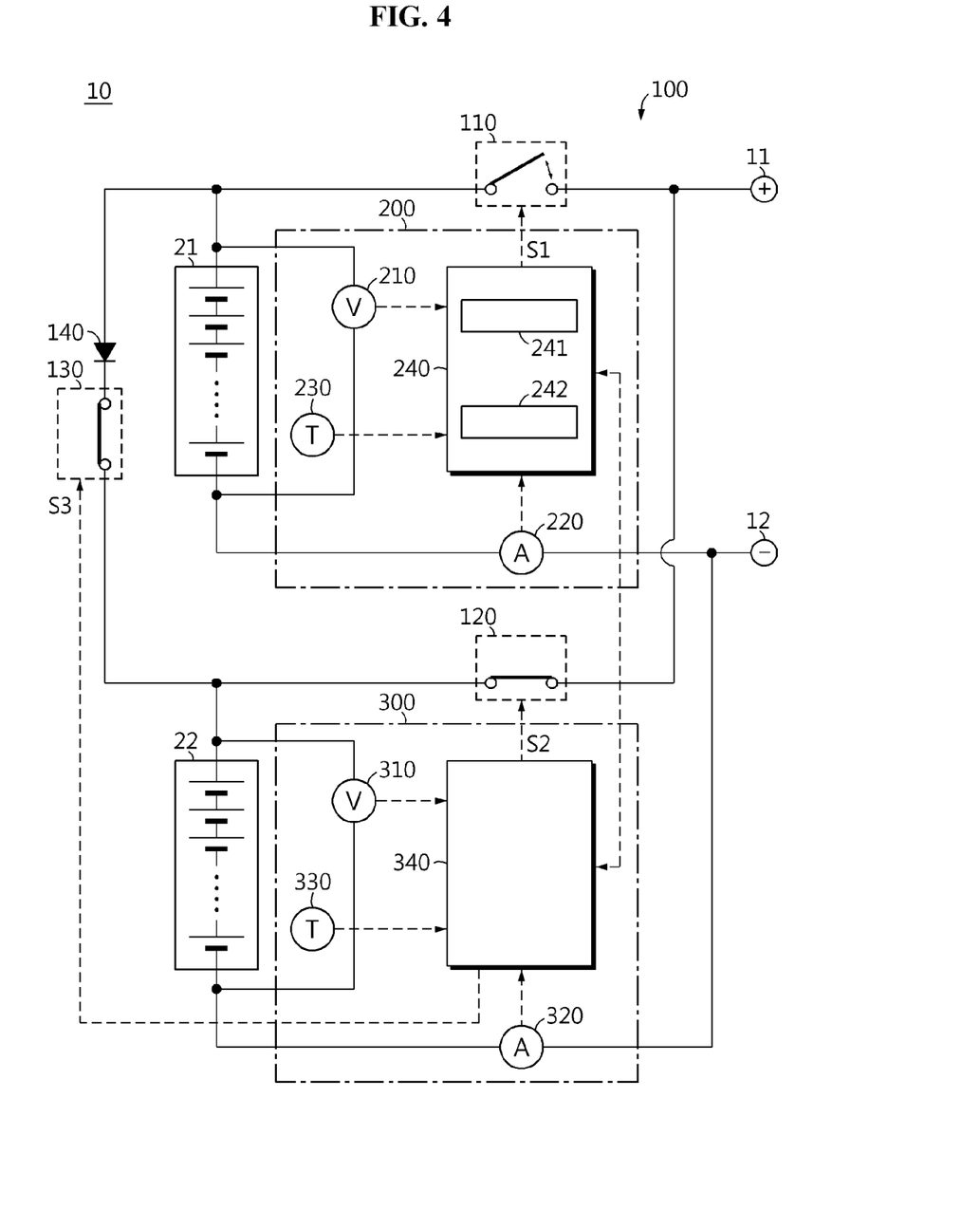
FIG. 4 is a diagram for reference in illustrating the operation performed by a control apparatus when a first controller of FIG. 1 is malfunctioning.

FIG. 4 is a diagram for reference in illustrating the operation performed by the control apparatus 100 when the first controller 241 of FIG. 1 is malfunctioning.

Referring to FIG. 4, when the first controller 241 is determined to be malfunctioning by the second controller 242, the second controller 242 transmits a second diagnosis message to the SBMS 300 and transmits a sleep mode inducing signal to the first controller 241 to induce the first controller 241 to a sleep state. The second diagnosis message is a message for informing the SBMS 300 that the MBMS 200 is malfunctioning. In the sleep state, the first controller 241 stops outputting the first control signal S1.

The SBMS 300 outputs the second control signal S2 to the second main switch 120 in response to the second diagnosis message. Optionally, the SBMS 300 may output a third control signal S3 to the sub switch 130 in response to the second diagnosis message.

Accordingly, the first main switch 110 goes into a turn off state and the second main switch 120 goes into a turn on state as shown in FIG. 4, and thus, the sub battery 22 supplies power to the electrical load in replacement of the main battery 21.

Meanwhile, while the third control signal S3 is outputted to the sub switch 130, the SBMS 300 may compare the current measured by the current sensor 220 with the current measured by the current sensor 320. In detail, when the sub switch 130 has a turn on state by the third control signal S3, the main battery 21 and the sub battery 22 are connected in parallel, so the current measured by the current sensor 220 and the current measured by the current sensor 320 should have the same magnitude but the opposite directions. When the current measured by the current sensor 220 and the current measured by the current sensor 320 have the same direction, in case that a difference between the current measured by the current sensor 220 and the current measured by the current sensor 320 is larger than a preset threshold (for example, 0.5 A) or a ratio between the current measured by the current sensor 220 and the current measured by the current sensor 320 is outside of a preset threshold range (for example, 0.9 or more and 1.1 or less), the SBMS 300 may determine that a fault occurs in at least one of the current sensor 220 and the current sensor 320. When the SBMS 300 determines that the fault of at least one of the current sensor 220 and the current sensor 320, the SBMS 300 may output a signal informing that the fault occurs in at least one of the current sensor 220 and the current sensor 320 to an external device (for example, an ECU of an electric vehicle) connected to the SBMS 300 via a communication channel. The communication channel may be a CAN communication network provided in the electric vehicle. Additionally, the SBMS 300 may have a communication interface coupled to the communication channel.

Figure 5:
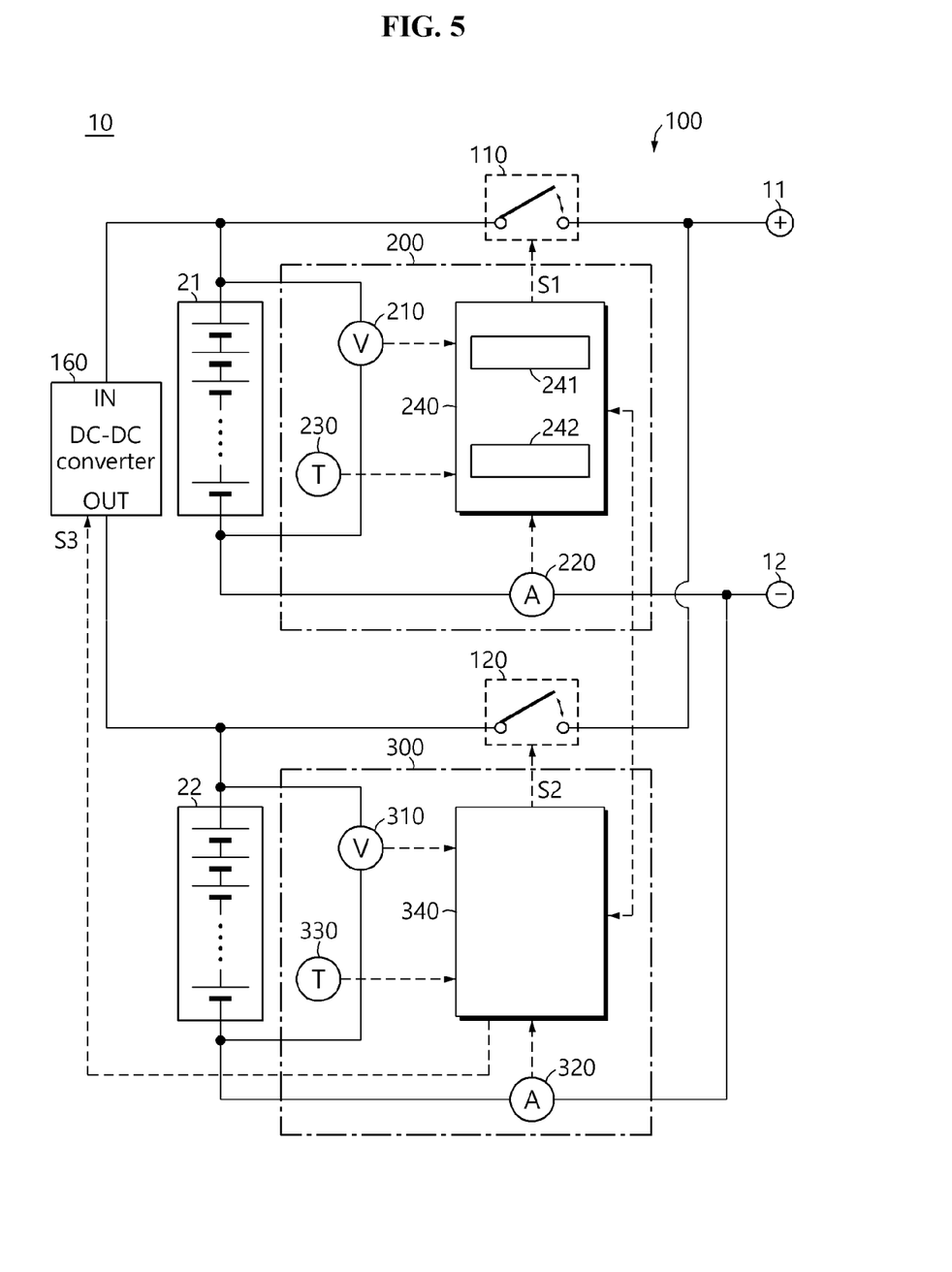
FIG. 5 is a diagram showing an exemplary configuration of a battery system according to another embodiment of the present disclosure.

FIG. 5 is a diagram showing an exemplary configuration of the battery system 10 according to another embodiment of the present disclosure.

Referring to FIG. 5, when compared with FIG. 1, there is a difference in that the diode 140 and the sub switch 130 are replaced with a DC-DC converter 160. Accordingly, for the remaining elements, the same reference signs are added, and redundant descriptions are omitted herein.

The input terminal IN of the DC-DC converter 160 is connected to the positive terminal of the main battery 21. The output terminal OUT of the DC-DC converter 160 is connected to the positive terminal of the sub battery 22.

In response to the third control signal S3, the DC-DC converter 160 generates an output voltage having a preset voltage level using the input voltage from the main battery 21 applied to the input terminal IN. When the output voltage generated by the DC-DC converter 160 is applied to the sub battery 22 through the output terminal OUT, the sub battery 22 is charged.

Figure 6:
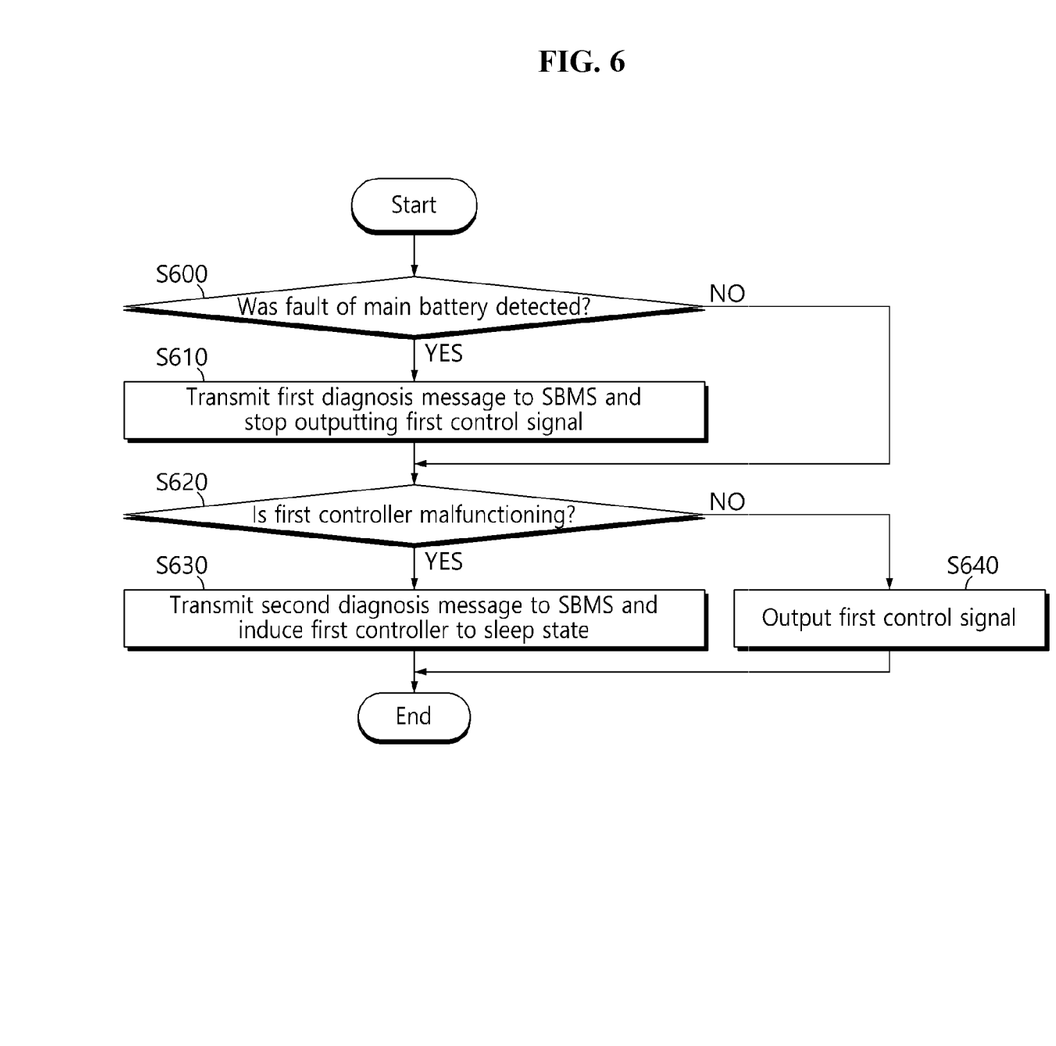
FIGS. 6 and 7 are exemplary flowcharts showing a method for controlling a main battery and a sub battery according to still another embodiment of the present disclosure.
Figure 7:
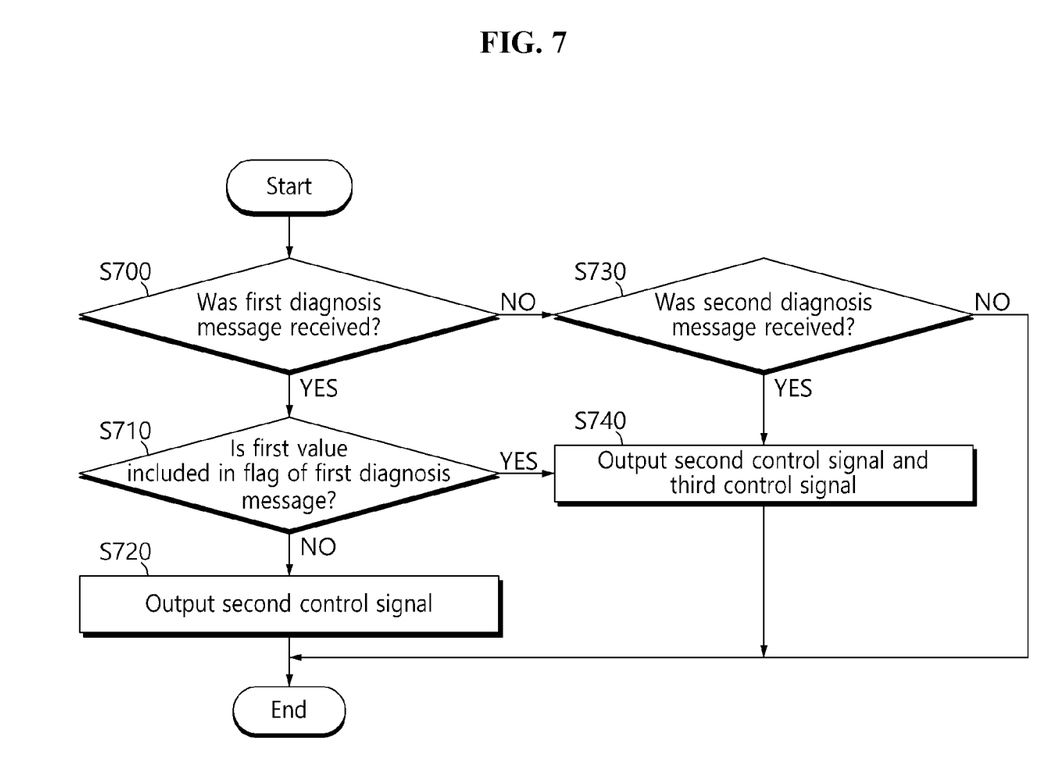

FIGS. 6 and 7 are exemplary flowcharts showing a method for controlling the main battery 21 and the sub battery 22 according to still another embodiment of the present disclosure. The flowchart shown in FIG. 6 shows a method performed by the control unit 240 of the MBMS 200, and the flowchart shown in FIG. 7 shows a method performed by the control unit 340 of the SBMS 300.

Referring to FIG. 6, in step S600, the first controller 241 determines whether a fault of the main battery 21 was detected. When a value of the step S600 is "YES", step S610 is performed. When the value of the step S600 is "NO", step S620 is performed.

In step S610, the first controller 241 transmits a first diagnosis message to the SBMS 300 and stops outputting the first control signal S1. The first diagnosis message is a message for informing the SBMS 300 that a fault of the main battery 21 is detected. The first diagnosis message has a flag including at least one value indicating the type of the detected fault of the main battery 21. The first control signal S1 is a signal for inducing the first main switch 110 into a turn on state.

In step S620, the second controller 242 determines whether the first controller 241 is malfunctioning. When a value of the step S620 is "YES", step S630 is performed. When the value of the step S620 is "NO", step S640 is performed.

In step S630, the second controller 242 transmits a second diagnosis message to the SBMS 300 and induces the first controller 241 to a sleep state. The second diagnosis message is a message for informing the SBMS 300 that the first controller 241 of the MBMS 200 is malfunctioning. The first controller 241 stops outputting the first control signal S1 in the sleep state.

In step S640, the first controller 241 outputs the first control signal S1 to the first main switch 110.

Referring to FIG. 7, in step S700, the control unit 340 determines whether the first diagnosis message was received from the control unit 240. When a value of the step S700 is "YES", step S710 is performed. When the value of the step S700 is "NO", step S730 is performed.

In step S710, the control unit 340 determines whether the first value is included in the flag of the first diagnosis message. The first value indicates that the main battery 21 is over-charged. When a value of the step S710 is "NO", step S720 is performed. When the value of the step S720 is "YES", step S740 is performed.

In step S720, the control unit 340 outputs the second control signal S2. The second control signal S2 is a signal for inducing the second main switch 120 into a turn on state.

In step S730, the control unit 340 determines whether the second diagnosis message was received from the control unit 240. When a value of the step S730 is "YES", step S740 is performed.

In step S740, the control unit 340 outputs the second control signal S2 and the third control signal S3. The third control signal S3 is a signal for inducing the sub switch 130 into a turn on state.

According to at least one of the embodiments of the present disclosure, when a fault occurs in the main battery 21 or the BMS 200 for the main battery 21 is malfunctioning, it is possible to supply power to the electrical load using the sub battery 22 installed connectably in parallel to the main battery 21.

Additionally, according to at least one of the embodiments of the present disclosure, it is possible to charge the sub battery 22 using the main battery 21 while the sub battery 22 is supplying power to the electrical load.

While the present disclosure has been hereinabove described with regard to a limited number of embodiments and drawings, the present disclosure is not limited thereto and it is obvious to those skilled in the art that various modifications and changes may be made thereto within the technical aspects of the present disclosure and the equivalent scope of the appended claims.

Additionally, as many substitutions, modifications and changes may be made to the present disclosure described hereinabove by those skilled in the art without departing from the technical aspects of the present disclosure, the present disclosure is not limited by the above-described embodiments and the accompanying drawings, and some or all of the embodiments may be selectively combined to allow various modifications.

DESCRIPTION OF REFERENCE NUMERALS

10: Battery system
11, 12: Power terminal
21: Main battery
22: Sub battery
100: Control apparatus
110: First main switch
120: Second main switch
130: Sub switch
200: Main battery management system
300: Sub battery management system

What is claimed is:

1. An apparatus for controlling a main battery and a sub battery, the apparatus comprising:
   a first main switch connectable between the main battery and an electrical load;
   a second main switch connectable between the sub battery and the electrical load;
   a sub switch connectable between the main battery and the sub battery;
   a main battery management system operably coupled to the first main switch; and
   a sub battery management system operably coupled to the second main switch and the sub switch,
   wherein the main battery management system is configured to transmit a first diagnosis message to the sub battery management system, and stop outputting a first control signal to the first main switch to induce the first main switch into a turn off state, when a fault of the main battery is detected,
   wherein the first diagnosis message has a flag including at least one value indicating a type of the detected fault, and
   wherein the sub battery management system is configured to output a second control signal to the second main switch to induce the second main switch into a turn on state, in response to the first diagnosis message.

2. The apparatus according to claim 1, wherein the sub battery management system is configured to output a third control signal to the sub switch to induce the sub switch into the turn on state, when a first value is included in the flag, and
   wherein the first value indicates that the main battery is over-charged.

3. The apparatus according to claim 1, wherein the sub battery management system is configured to stop outputting a third control signal to the sub switch to induce the sub switch into the turn off state, when a second value or a third value is included in the flag,
- wherein the second value indicates that the main battery is over-discharged, and
- wherein the third value indicates that the main battery is over-heated.

4. The apparatus according to claim 1, wherein the main battery management system is configured to stop transmitting the first diagnosis message and output the first control signal to the first main switch, when the fault of the main battery is resolved, and
- wherein the sub battery management system is configured to stop outputting the second control signal when the transmission of the first diagnosis message from the main battery management system is stopped.

5. The apparatus according to claim 1, wherein the main battery management system includes:
- a first controller configured to detect whether the fault occurred in the main battery based on at least one of a voltage, a current and a temperature of the main battery; and
- a second controller operably coupled to the first controller, wherein the second controller is configured to transmit a second diagnosis message to the sub battery management system and induce the first controller to a sleep state when the second controller determines that the first controller is malfunctioning, and
- wherein the sub battery management system is configured to output the second control signal to the second main switch, in response to the second diagnosis message.

6. The apparatus according to claim 5, wherein the sub battery management system is configured to output a third control signal to the sub switch to induce the sub switch into the turn on state, in response to the second diagnosis message.

7. A battery system comprising:
- the apparatus according to claim 1;
- the main battery; and
- the sub battery.

8. A method for controlling a main battery and a sub battery using a first main switch connectable between the main battery and an electrical load, a second main switch connectable between the sub battery and the electrical load, a sub switch connectable between the main battery and the sub battery, a main battery management system operably coupled to the main battery and the first main switch and configured to detect a fault of the main battery, and a sub battery management system operably coupled to the second main switch and the sub switch, the method comprising:
- transmitting, by the main battery management system, a first diagnosis message to the sub battery management system, and stopping outputting a first control signal to the first main switch to induce the first main switch into a turn off state, when a fault of the main battery is detected, wherein the first diagnosis message has a flag including at least one value indicating a type of the detected fault; and
- outputting, by the sub battery management system, a second control signal to the second main switch to induce the second main switch into a turn on state, in response to the first diagnosis message.

9. The method according to claim 8, further comprising:
- outputting, by the sub battery management system, a third control signal to the sub switch to induce the sub switch into the turn on state, when a first value is included in the flag,
- wherein the first value indicates that the main battery is over-charged.

10. The method according to claim 8, further comprising:
- stopping, by the sub battery management system, outputting a third control signal to the sub switch to induce the sub switch into the turn off state, when a second value or a third value is included in the flag,
- wherein the second value indicates that the main battery is over-discharged, and
- wherein the third value indicates that the main battery is over-heated.

11. The method according to claim 8, further comprising:
- outputting, by the sub battery management system, the second control signal to the second main switch, in response to a second diagnosis message from the main battery management system,
- wherein the second diagnosis message indicates that the main battery management system is malfunctioning.

* * * * *